US005612521A

United States Patent [19]

Bistekos

[11] Patent Number: 5,612,521

[45] Date of Patent: Mar. 18, 1997

[54] ELECTRICAL OR ELECTRONIC APPARATUS SWITCHING DEVICE INCLUDING ACTUATOR MAGNETIC LATCHING

[76] Inventor: Michael-Georg Bistekos, Greinergasse 36/2/7, A-1190 Wien, Austria

[21] Appl. No.: 349,620

[22] Filed: Dec. 5, 1994

Related U.S. Application Data

[63] Continuation of PCT/AT93/00094, Jun. 7, 1993.

[30] Foreign Application Priority Data

Jun. 9, 1992 [AT] Austria .................................... 1173/92

[51] Int. Cl.[6] ............................ H01H 25/04; G05G 1/02; H03K 17/968; H03K 17/975

[52] U.S. Cl. ..................... 200/16 R; 200/16 C; 200/600; 335/205; 335/207; 250/227.22; 250/229

[58] Field of Search ................................ 200/600, 16 R, 200/16 F; 335/205–208; 250/227.22, 229, 578.1, 227.21

[56] References Cited

U.S. PATENT DOCUMENTS

| | | | |
|---|---|---|---|
| 1,425,070 | 8/1922 | Ward | 180/333 |
| 1,549,211 | 8/1925 | Palevich | 200/16 C |
| 3,736,397 | 5/1973 | Pedersen | 200/5 R X |
| 3,822,372 | 7/1974 | Coenen et al. | 335/206 |
| 3,916,360 | 10/1975 | Pedersen et al. | 335/205 |
| 4,054,944 | 10/1977 | Lau | 335/207 |
| 4,068,202 | 1/1978 | Lyons, III | 335/207 |
| 4,224,604 | 9/1980 | Angst | 250/231.14 |
| 4,417,817 | 11/1983 | Bohme et al. | 356/380 |

FOREIGN PATENT DOCUMENTS

| | | | |
|---|---|---|---|
| 2423853 | 11/1979 | France | H01H 25/00 |
| 2429840 | 1/1976 | Germany | H01H 25/00 |

OTHER PUBLICATIONS

PCT Search Report; PCT/AT93/00094; 10 Sep. 1993.

*Primary Examiner*—J. R. Scott
*Attorney, Agent, or Firm*—Herbert L. Lerner; Laurence A. Greenberg; Werner H. Stemer

[57] ABSTRACT

A switching device for programmable control of electrical and electronic apparatus includes a support plate and a slide switch which is moved along a forked guide track defined on the support plate. The support plate is formed of magnetically conducting material or a magnetic plate is disposed below the support plate. The actuating slide is provided with magnets which cooperate with the magnetically conductive support. Several switching elements disposed along the track, which switching elements, upon being actuated by the actuating member, effect control processes of the electrical or electronic apparatus. The switches may be interrupted conductor tracks, capacitive sensors, proximity switches, light gates, and the like. A symbol plate is disposed above the support plate and the slide is moved along through-openings in the symbol plate which define the switching options. The operator follows the guide of the labels disposed on the symbol plate.

12 Claims, 5 Drawing Sheets

ELECTRICAL OR ELECTRONIC APPARATUS SWITCHING DEVICE INCLUDING ACTUATOR MAGNETIC LATCHING

CROSS-REFERENCE TO RELATED APPLICATION

This is a continuation of international application PCT/AT 93/00094, filed Jun. 7, 1993, in Austria and designating the United States.

BACKGROUND OF THE INVENTION

Field of the Invention

The invention relates to a device for programmable control of electrical and electronic apparatus with a switching device, which comprises an actuator element and a plurality of switch elements, whereby different control processes are effected with the individual switch elements.

It has been known heretofore to control electrical or electronic apparatus by providing programing circuits which are programmable by way of inputting a plurality of data through actuating pushbuttons or the like. Although a multitude of different control processes can be attained thereby, these prior art assemblies have the disadvantage that it is often a preliminary requirement of the operator to study the operating instructions and completely understand and know the control processes. Otherwise it is often impossible to make the correct selection at the input. In other words, programming requires a good knowledge of the possible control processes.

SUMMARY OF THE INVENTION

It is accordingly an object of the invention to provide a device for controlling electrical and electronic apparatus, which overcomes the hereinafore-mentioned disadvantages of the heretofore-known devices of this general type and which simplifies programming substantially. It is an object to still provide all possible control processes while the operator need choose among only a small number of control processes, and whereby the choice may be implemented mechanically.

With the foregoing and other objects in view there is provided, in accordance with the invention, a switching device for electrical and electronic apparatus, in which predetermined control processes are actuated by switching respective ones of a plurality of switching elements, comprising:

a support plate of magnetically conducting material on which a predetermined, branching guide track is defined;

an actuating member in the form of a slide which is adjustable along the guide track;

and a plurality of switching elements disposed along the track, the switching elements, upon being actuated by the actuating member, effecting control processes; and permanent magnets disposed on the slide for magnetically adhering the slide to the support plate.

In other words, the objects of the invention are attained in that the actuating element is formed as a slide which can be shifted along a predetermined, preferably forking, track in whose path the switching elements are disposed. In such a device, the user need only adjust the slide along the track, whereby control operations are initiated and performed at predetermined locations. With this, the shifting of the slide necessarily effects a sequence of switching processes.

In accordance with another feature of the invention, the device includes a symbol plate disposed above the support plate in a spaced relationship therewith, the symbol plate having through-openings formed therein, the through-openings being formed in a mutually contiguous relationship and defining the guide track for the slide, along which guide track the switching elements are disposed which are actuated by the slide.

In accordance with an additional feature of the invention, the device includes a switching plate disposed below the support plate, a contactor disposed on the slide, the switching elements including contacts disposed on the switching plate below the support plate, the contacts being actuatable with the contactor of the slide.

The preferred embodiment of the invention, therefore, provides a support plate, which is formed of a magnetically highly conductive material, and above which there is provided a symbol plate, which is formed with through-openings, which define the guide track for the slide along whose path the switching elements are disposed which are actuated with the slide. The switching elements can thereby be provided below the support plate and the lower end of the slide can be formed as a contactor for contacts, which are actuatable with the slide.

In accordance with an added feature of the invention, an adjusting spring, preferably a compression spring, is provided which biases the contactor against the contacts.

In accordance with a further feature of the invention, the support plate has through-openings formed therein along a path defined by the guide track, and the contactor contacts the contacts through the openings.

The slide may be formed with a handle similar to a joystick, and a joint may be provided allowing the handle to be pivoted or swivelled.

With the above and other objects in view there is also provided, in accordance with the invention, a switching device for electrical and electronic apparatus, in which predetermined control processes are actuated by switching respective ones of a plurality of switching elements, comprising: a support plate on which a predetermined, branching guide track is defined; an actuating member in the form of a slide which is adjustable along the guide track; the actuating member carrying permanent magnets; a plurality of switching elements in the form of capacitive sensors disposed on the support plate, the switching elements, upon being actuated by the actuating member, effecting control processes; and a plate of magnetically conducting material disposed below the support plate.

In accordance with a preferred embodiment the slide has a bolt which protrudes through the symbol plate and which carries a disk, at which permanent magnets are disposed which cause the disk to lie flush on the support plate. The bolt can furthermore be provided with a contactor at an end thereof, whereby a pressure spring is disposed between the disk and the contactor so as to bias the contactor against a respective contact.

Finally, it is also possible, in accordance with a further preferred embodiment, that rest positions associated with the switch elements are defined, and that the support plate is provided with recesses in the vicinity of the switch elements in which the slide is arrestible.

Other features which are considered as characteristic for the invention are set forth in the appended claims.

Although the invention is illustrated and described herein as embodied in a device for controlling electrical and electronic apparatus, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of the specific embodiment when read in connection with the accompanying drawings.

DESCRIPTION OF THE PREFERRED EMBODIMENTS

Figure 1:
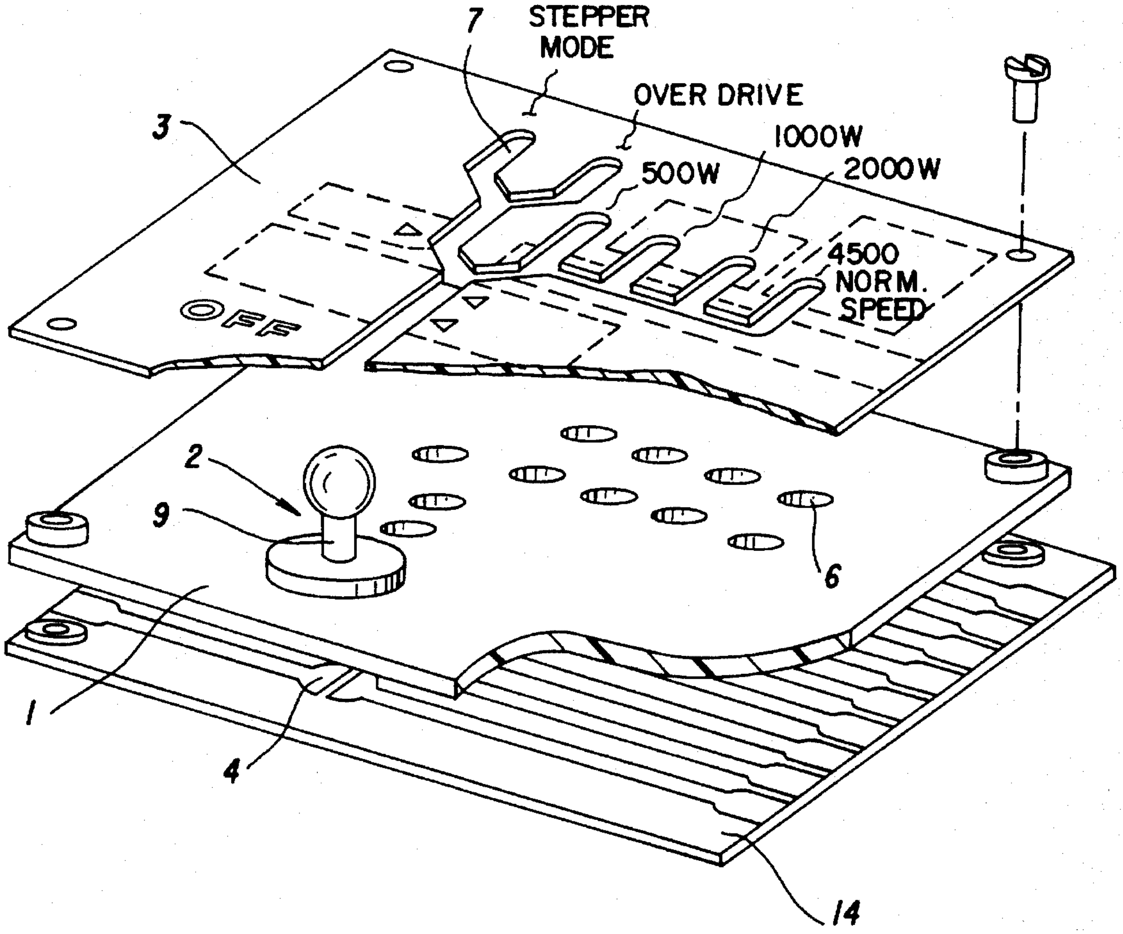
FIG. 1 is a partly broken-away, exploded, perspective view of a first embodiment of the apparatus of the invention.

Referring now to the figures of the drawing in detail and first, particularly, to FIG. 1 thereof, there is seen a support plate 1 which is formed with a plurality of through-openings 6. Print contacts 4 disposed on a switching plate or conductor track plate 14 are actuated by means of a slide 2 through the through-openings 6. A symbol plate 3 is disposed above the support plate 1. A plurality of contiguous through-openings 7 are formed in the symbol plate 3. The through-openings 7 form a guide track for a bolt 9 of the slide 2 projecting therethrough.

The print contacts 4, which are actuated, i.e. closed, with the slide 2 for triggering control processes, are disposed below the support plate 1 along the path of the guide track defined by the through-openings 7. The upper side (top surface) of the symbol plate 3 carries a plurality of labels. The labels provide the necessary guidance to the user by indicating which switching or control processes are effected by moving the slide 2 into one of the possible positions.

Figure 2A:
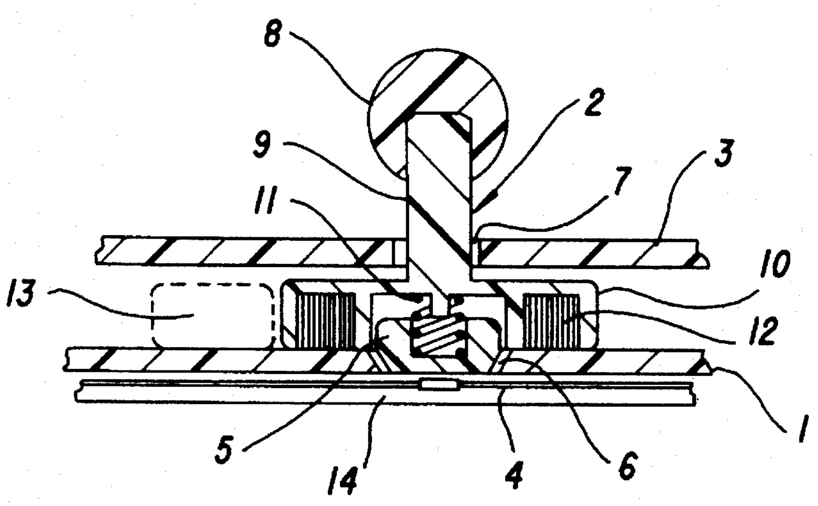
FIG. 2*a* is an axial-sectional view through a first embodiment of a contactor.
Figure 2B:
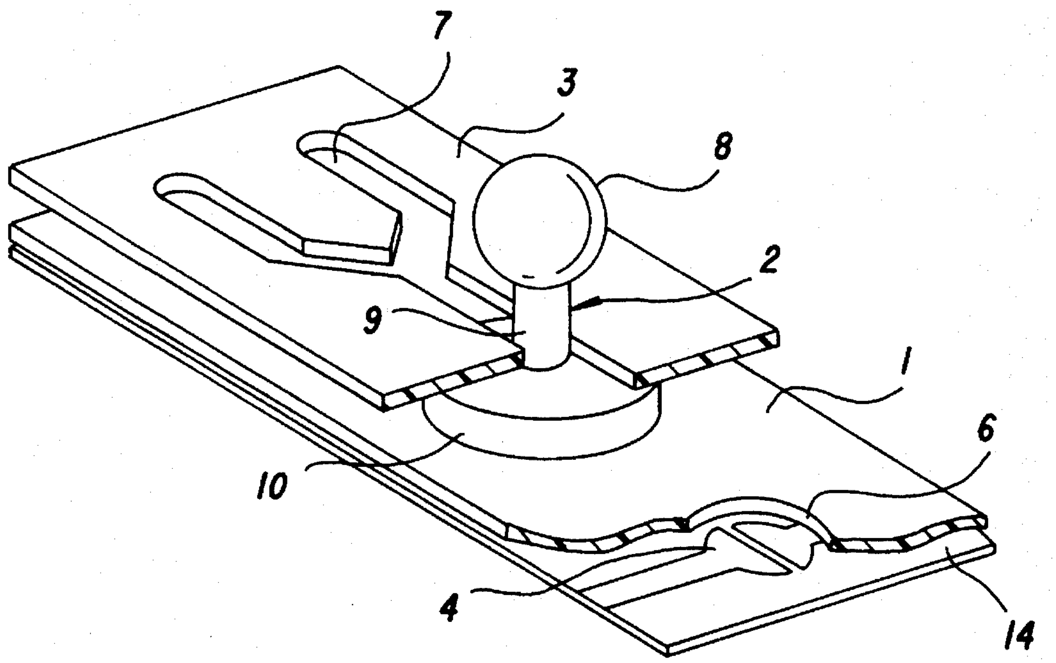
FIG. 2*b* is a partly broken-away, sectional view of the contactor of FIG. 2*a;*

A first embodiment of the slide 2 is illustrated in FIGS. 2*a* and 2*b*. In this embodiment the slide 2 comprises a bolt 9 which extends through the symbol plate 3 at the through-openings 7. The bolt 9 is provided with a switch knob 8 at its upper end. A disk 10 is attached to the lower end of the bolt 9. The disk 10 rests against the upper surface of the support plate 1. The lower surface of the disk 10 is formed as a contact maker or contactor 5 for the print contacts 4 located on the switching plate 14. A compression spring 11 (adjusting spring) is located between the disk 10 and the contactor 5, which is located opposite therefrom. The disk 10 is furthermore formed with permanent magnets 12, which rest on the support plate 1. The support plate 1 is formed of magnetically conducting material. The contactor 5 is arrestible in the bores 6, which are formed in the support plate 1.

As the slide 2 is shifted, i.e. pushed, along the control track formed in the symbol plate 2, the contactor 5 snaps into bores 6, which causes the contacts 4 disposed below to be actuated and corresponding control processes to be effected. In other words, as the contactor 5 is allowed to snap into a respective bore 6, a contact of the underlying conductor strip is closed and the conductor is shorted. The choice along which path the slide 2 is moved is made with the guidance of the labels provided on the symbol plate 3. Due to the fact that permanent magnets 12 are provided at the disk 10 and that the support plate 1 is formed of magnetically conducting material, the slide 2 rests on the support plate 1 under the effect of the magnetic force. It is pointed out in this context that the embodiment of FIGS. 2*a* and 2*b* may be altered in that the print contacts 4 disposed below the support plate 1 are replaced with inductive proximity switches 13 above the support plate 1. These proximity switches 13 are then actuated by the disk 10.

Figure 3:
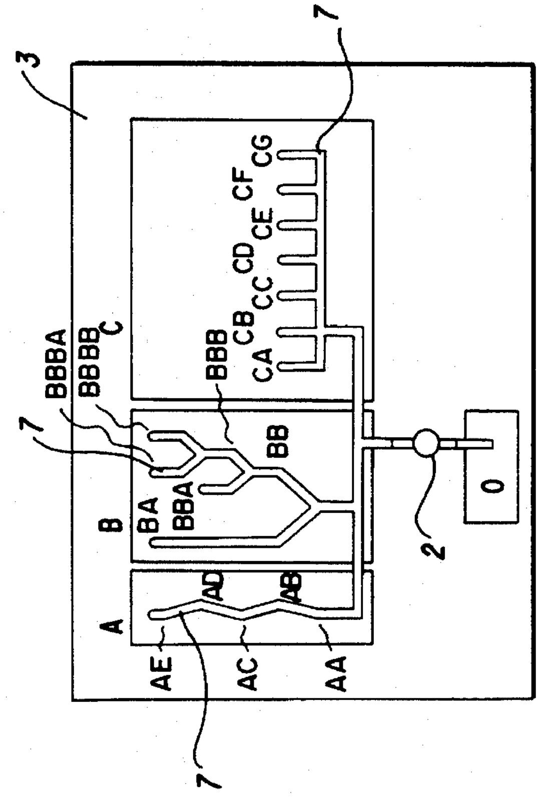
FIG. 3 is a schematic top-plan illustration of various possible control processes.

With reference to FIG. 3, three variants A, B and C of different guide tracks are illustrated along which the slide 2 is moveable. As can be seen therefrom, they can be formed with mutually continuing segments, wherein a switching element is associated with the end of each segment, for instance at each of the letter codes.

The control track may furthermore comprise a multiplicity of branches, whereby one must choose the further movement of the slide at each branch fork.

Figure 4:
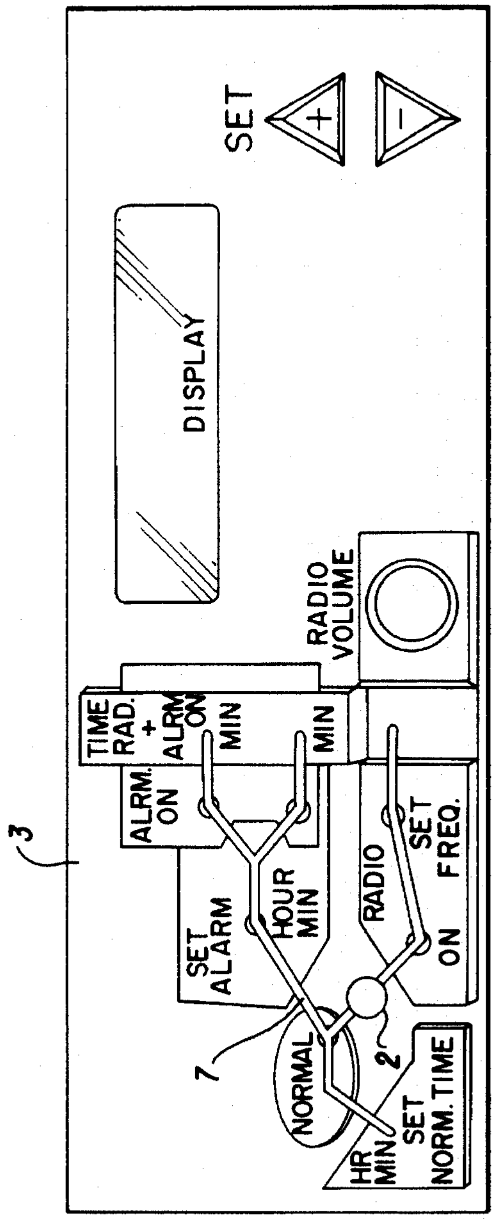
FIG. 4 the schematic top-plan view of an exemplary device according to the invention for controlling a radio/alarm clock.

FIG. 4 details an exemplary embodiment of the inventive device in the form of a symbol panel of a radio alarm which is provided with a display. Starting out from the initial position (NORMAL) of the slide, a position may be assumed in which the time is entered (SET NORMAL TIME). At a first forking branch of the guide track one must decide whether the alarm is to be turned on (SET ALARM), whereby the time of the alarm may be programmed, or whether the radio is to be turned on (RADIO ON). From the alarm position one must decide whether a radio signal (RADIO ALARM) should be provided or a buzzer (BUZZER ALARM). A further shift of the slide also turns on the radio, wherein the time period during which the radio remains on may be inputted (commonly referred to as the sleep timer).

If, on the other hand, only the radio is turned on, a further shift of the slide leads to a position in which a program may be selected (SET FREQUENCY). Upon yet a further shift, a position is reached in which one may program the time period during which the radio is to remain turned on (sleep timer).

Figure 5A:
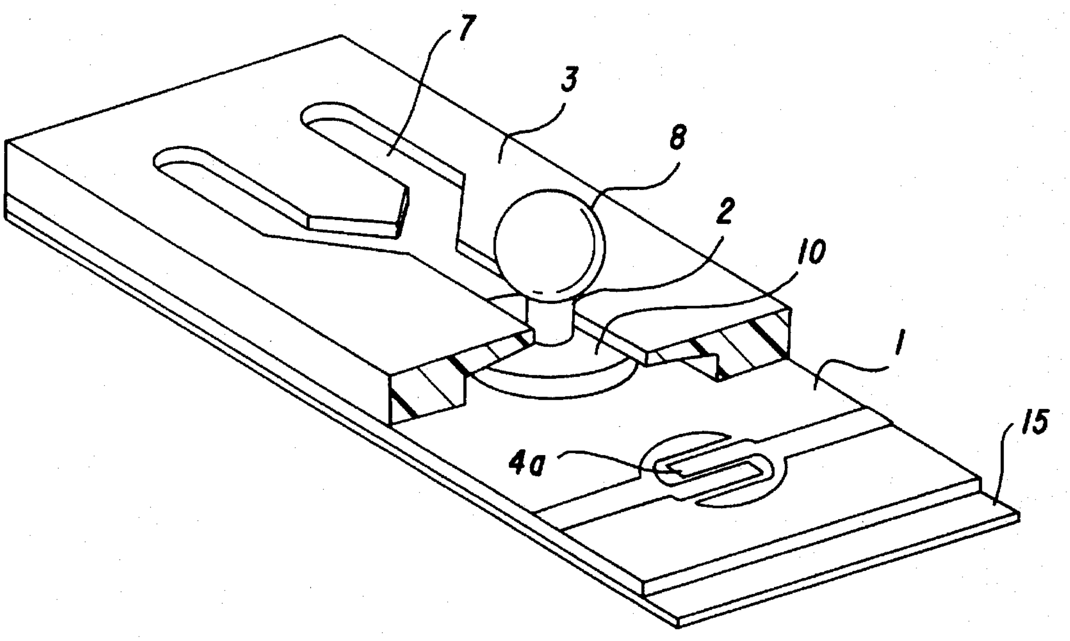
FIG. 5*a* is a view similar to that of FIG. 2*b* of a second embodiment of the contactor.
Figure 5B:
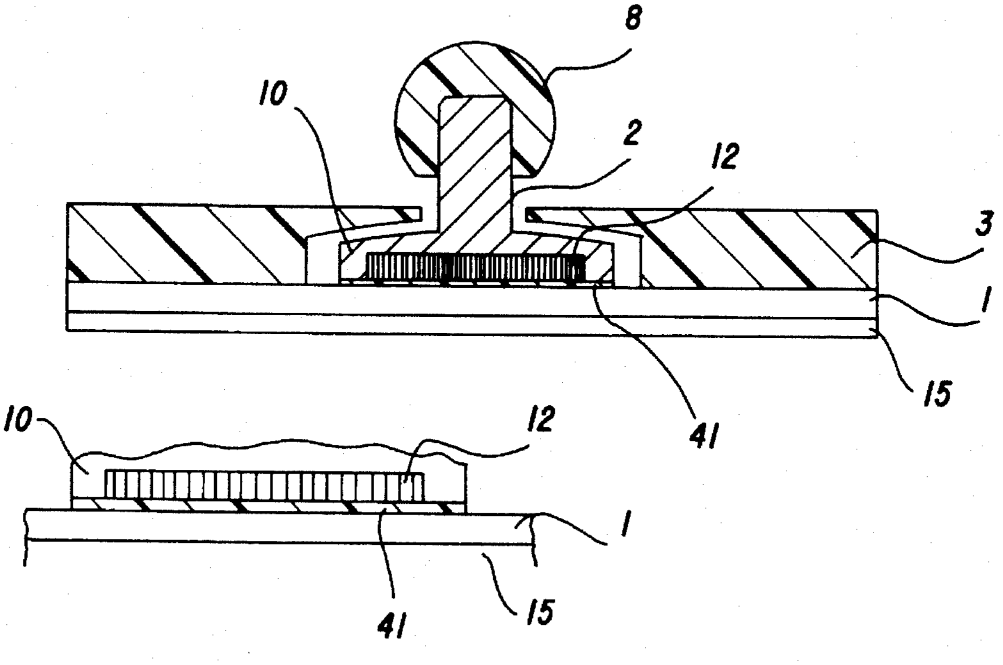
FIG. 5*b* is a view similar to that of FIG. 2*a* of the second embodiment of the contactor illustrated in FIG. 5*a;*

With reference to FIGS. 5*a* and 5*b*, the contacts of a second embodiment are formed with capacitive sensors. The symbol plate 3 formed with the through-openings 7 is labeled in the respectively local language and may be exchanged. The support plate 1 is formed with etched-in capacitive sensors 4*a*. Below the support plate 1 there is disposed a plate 15 which is formed of soft iron and with which the permanent magnets 12 disposed in the disk 10 of the slide 2 cooperate. The disk 10 is furthermore formed with a slide cup 41 of electrically insulating plastic.

Due to the fact that an alternating field is applied at the capacitive sensors 4*a*, a capacitive coupling of the individual contacts 4*a* takes place by means of the slide 2.

Figure 6:
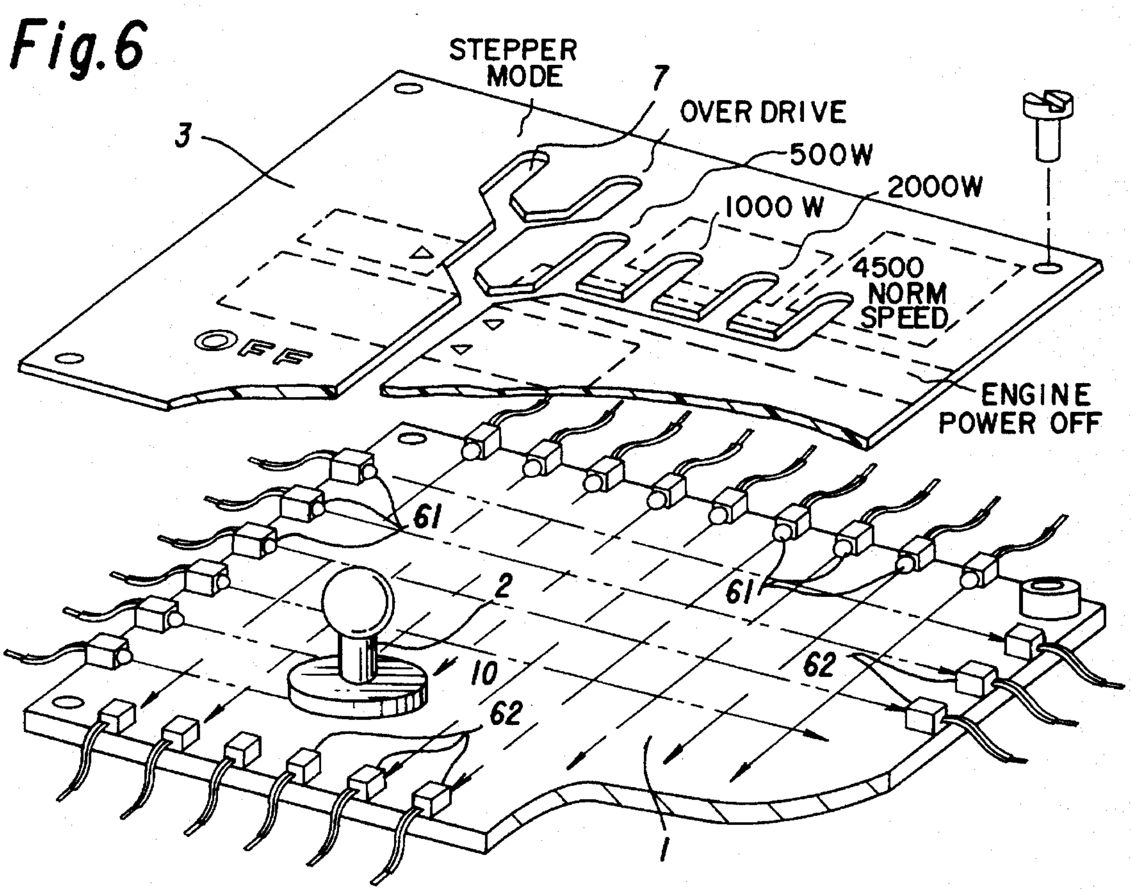
FIG. 6 is a view similar to that of FIG. 1 showing a third embodiment of the contacts and contactor.

In accordance with the third embodiment illustrated in FIG. 6, the control elements consist of two groups of light gates formed by emitters 61 and sensors 62. Mutually intersecting light gates are respectively broken by the slide 2.

Again, the slide 2 is provided with magnets in this embodiment and the support plate 1 is formed of magnetically conducting material.

Figure 7:
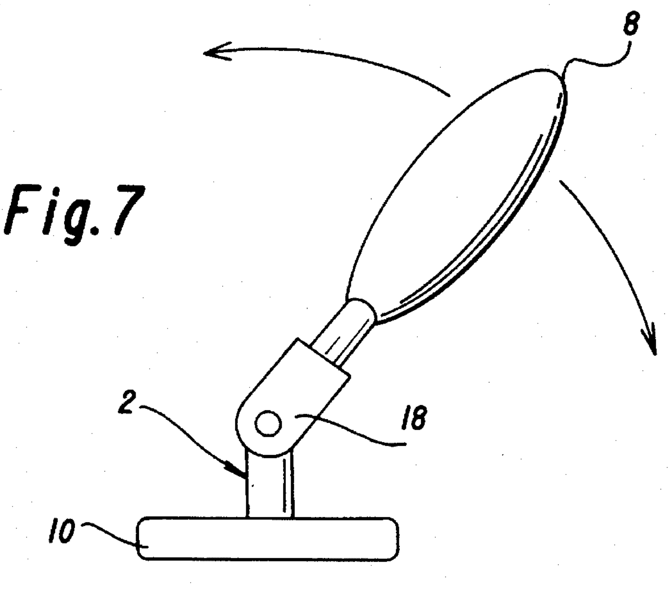
FIG. 7 is a side-elevational view of a preferred embodiment of the slide according to the invention.

FIG. 7, finally, illustrates a slide 2, the handle 8 of which is swivellable by means of a joint 18.

It is common to all embodiments that the slide 2 is provided with permanent magnets, which cooperate with a magnetically conducting plate, which assures that the slide 2 is fixed in its position, yet is easily moved along the guide track.

I claim:

1. A switching device for electrical and electronic apparatus, in which predetermined control processes are actuated by switching respective ones of a plurality of switching elements, comprising:

a support plate of magnetically conducting material on which a predetermined, forking guide track with a plurality of branches is defined;

an actuating member in the form of a slide which is movable along said guide track;

and a plurality of switching elements attached to said support plate and disposed along said track, said switching elements, upon being selectively actuated by said actuating member, effecting control processes; and permanent magnets disposed on said slide for magnetically adhering said slide to said support plate.

2. The device according to claim 1, which further comprises a symbol plate disposed above said support plate in a spaced relationship therewith, said symbol plate having through-openings formed therein, said through-openings being formed in a mutually contiguous relationship and defining said guide track for said slide, along which guide track said switching elements are disposed which are actuated by said slide.

3. The device according to claim 1, which further comprises a switching plate disposed below said support plate, a contactor disposed on said slide, said switching elements including contacts disposed on said switching plate below said support plate, said contacts being actuatable with said contactor of said slide.

4. The device according to claim 3, which further comprises an adjusting spring disposed between said slide and said contactor, said spring biasing said contactor against said contacts.

5. The device according to claim 3, wherein said support plate has through-openings formed therein along a path defined by said guide track, said contactor contacting said contacts through said openings.

6. The device according to claim 1, which further comprises a symbol plate disposed above said support plate in a spaced relationship therewith, said symbol plate having through-openings formed therein in a mutually contiguous relationship and defining said guide track for said slide, a switching plate disposed below said support plate, a contactor disposed on said slide, said switching elements including contacts disposed on said switching plate below said support plate, said contacts being actuatable with said contactor of said slide, an adjusting spring disposed on said slide and biasing said contactor against said contacts, said support plate having through-openings formed therein along a path defined by said guide track, and said contactor contacting said contacts through said openings.

7. The device according to claim 1, wherein said slide includes a handle and a joint for allowing pivoting of said handle.

8. The device according to claim 1, wherein said switching elements are formed by two groups of mutually intersecting light gates, said light gates being selectively interruptible by said slide.

9. A switching device for electrical and electronic apparatus, in which predetermined control processes are actuated by switching respective ones of a plurality of switching elements, comprising:

a support plate on which a predetermined, branching guide track is defined;

an actuating member in the form of a slide which is adjustable along said guide track; said actuting member carrying permanent magnets;

a plurality of switching elements disposed on said support plate, said switching elements, upon being selectively actuated by said actuating member, effecting control processes; and a plate of magnetically conducting material disposed below said support plate for magnetically attracting said permanent magnets carried by said actuating member.

10. The device according to claim 9, wherein said switching elements are formed by two groups of mutually intersecting light gates, said light gates being selectively interruptible by said slide.

11. The device according to claim 9, wherein said slide includes a handle and a joint for allowing pivoting of said handle.

12. The device according to claim 9, wherein said switching devices are capacitive sensors.

* * * * *